United States Patent
Arigliano

(10) Patent No.: US 6,940,444 B1
(45) Date of Patent: Sep. 6, 2005

(54) DOMINO ASYNCHRONOUS SUCCESSIVE APPROXIMATION ADC

(75) Inventor: Antonello Arigliano, Germering (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 10/983,064

(22) Filed: Nov. 5, 2004

(30) Foreign Application Priority Data

Nov. 3, 2004 (EP) .................................. 04368070

(51) Int. Cl.[7] ............................................. H03M 1/38
(52) U.S. Cl. ...................................... 341/161; 341/162
(58) Field of Search ........................ 341/115, 118, 120, 341/122, 155, 156, 157, 158, 161–163

(56) References Cited

U.S. PATENT DOCUMENTS

| | | | | |
|---|---|---|---|---|
| 4,315,254 A | * | 2/1982 | Honjyo et al. ............... | 341/120 |
| 6,404,375 B1 | * | 6/2002 | Munoz et al. ............... | 341/172 |
| 6,433,727 B1 | * | 8/2002 | Yoshinaga ................... | 341/172 |
| 6,545,625 B2 | * | 4/2003 | Hottgenroth ................ | 341/155 |
| 6,552,676 B1 | * | 4/2003 | Bjorksten et al. ........... | 341/143 |
| 6,587,066 B1 | * | 7/2003 | Somayajula ................ | 341/172 |
| 6,628,216 B2 | * | 9/2003 | Chen et al. .................. | 341/120 |
| 6,686,865 B2 | * | 2/2004 | Confalonieri et al. ....... | 341/172 |
| 6,707,403 B1 | | 3/2004 | Hurrell ........................ | 341/120 |
| 6,707,492 B1 | * | 3/2004 | Itani .......................... | 348/229.1 |
| 6,731,232 B1 | | 5/2004 | Kearney ..................... | 341/163 |
| 6,747,589 B2 | | 6/2004 | Srinivasan et al. ......... | 341/172 |
| 2003/0206038 A1 | | 11/2003 | Mueck et al. ................. | 327/50 |

FOREIGN PATENT DOCUMENTS

| | | | | |
|---|---|---|---|---|
| FR | 2598572 A | 11/1987 | .......... | H03M 1/44 |
| GB | 2228155 A | 8/1990 | ........... | H03M 1/42 |

* cited by examiner

Primary Examiner—Michael Tokar
Assistant Examiner—Linh V. Nguyen
(74) Attorney, Agent, or Firm—George O. Saile; Stephen B. Ackerman

(57) ABSTRACT

The domino asynchronous successive approximation (ASA) analog-to-digital converter (ADC) converts an analog signal to an n-bits digital signal. The domino ASA ADC is made out of n-blocks, corresponding to the number of n-bits of the digital output. Each of these n-blocks generates a conversion bit and calibrates all following blocks, comparable to a domino structure. One key advantage of the domino ASA ADC is its modular structure; each block is independent from all others. The unity capacitors used need to be matched only within their specific blocks. The architecture is very flexible; it is possible to increase the resolution by adding more blocks of the same kind. The ASA ADC is very fast, its speed is only limited the RC constants during the sampling and measurement phase and the speed of the comparators used.

6 Claims, 3 Drawing Sheets

DOMINO ASYNCHRONOUS SUCCESSIVE APPROXIMATION ADC

BACKGROUND OF THE INVENTION

(1) Field of the Invention

This invention relates generally to analog-to-digital converters (ADCs), and more particularly to asynchronous successive approximation (ASA) ADCs.

(2) Description of the Prior Art

The analog-to-digital conversion (ADC) is absolutely a prerequisite for digital signal processing. Most signals are analog by nature and have to be converted to digital format for a further digital signal processing. ADC bottlenecks are dynamic range, conversion speed, and power consumption.

Successive-approximation-register (SAR) analog-to-digital converters (ADCs) are frequently the architecture of choice for medium-to-high-resolution applications, typically with sample rates fewer than 5 megasamples per second (Msps). SAR ADCs most commonly range in resolution from 8 to 16 bits and provide low power consumption as well as a small form factor. This combination makes them commonly used for a wide variety of applications, such as portable/battery-powered instruments, pen digitizers, industrial controls, and data/signal acquisition.

There is still a need for high performance, low-power and low electromagnetic interference (EMI) ADCs. There are various patents available to improve the performance of ADCs:

U.S. Pat. No. 6,747,589 (to Srinivasan et al.) teaches a SAR ADC, which is operated by sampling an input voltage and redistributing a corresponding charge among the coupling capacitor and a plurality of binarily weighted capacitors of a CDAC array to produce a first voltage on a charge summing conductor. A successive approximation bit testing/conversion operation is performed at a first speed on a first group of bits, beginning with the MSB, to determine the bits of the first group with at least a first level of accuracy. A first error correction operation includes performing a bit testing/conversion operation on a last bit of the first group at a second speed which is lower than the first speed to determine the bits of the first group at least a second level of accuracy which is more accurate than the first level of accuracy. Both the voltage on the charge summing conductor and the bits of the group are incremented or decremented as necessary to elevate the level of accuracy of bits of the first group to at least the second level of accuracy.

U.S. Pat. No. 6,731,232 (to Kearney) discloses a programmable input voltage range analog-to-digital converter in which a split gate oxide process allows the use of high voltage (.+-.0.15 volt) switches on the same silicon substrate as standard sub-micron 5-volt CMOS devices. With this process, the analog input voltage can be sampled directly onto one or more sampling capacitors without the need for prior attenuation circuits. By only sampling on a given ratio of the sampling capacitors, the analog input can be scaled or attenuated to suit the dynamic range of the SAR (successive approximation register) ADC itself. In the system of the present invention, the sampling capacitor can be the actual capacitive redistribution digital-to-analog converter (CapDAC) used in the SAR ADC itself, or a separate capacitor array. By selecting which bits of the CapDAC or separate sampling array to sample on, one can program the input range. Once the analog input signal has been attenuated to match the allowed dynamic range of the SAR converter, traditional SAR techniques can be used to convert the input signal to a digital word.

U.S. Pat. No. 6,707,403 (to Hurrell) discloses an ADC of balanced architecture for determining a digital word corresponding to a sampled voltage of an input signal from an input line comprising a first capacitor circuit comprising a most significant capacitor array and a least significant capacitor array, which are capacitively coupled by a coupling capacitor. A second capacitor circuit coupled to ground balances the first capacitor circuit. A differential comparator compares the voltage on the first capacitor circuit with that on the second capacitor circuit. A SAR responsive to the output of the differential comparator outputs switch bits to a main switch network for selectively switching the capacitors of the first capacitor circuit to respective high and low voltage reference lines until the voltage on first and second inputs of the differential comparator are equal for determining the digital word corresponding to the sampled voltage on the input line. A first calibration circuit for calibrating the coupling capacitor for compensating for under or over capacitance of the coupling capacitor comprises a plurality of binary weighted first calibrating capacitors, which are coupled by a calibration coupling capacitor to the least significant capacitor array. A first calibration switch network is provided for selectively coupling the first calibrating capacitors to either the second input of the differential comparator, the first input of the differential comparator, or ground. By coupling appropriate ones of the first calibrating capacitors to the second input of the differential comparator over capacitance of the coupling capacitor is compensated for, and under capacitance is compensated for by coupling appropriate ones of the first calibrating capacitors to the first input of the differential comparator.

SUMMARY OF THE INVENTION

A principal object of the present invention is to achieve an asynchronous successive approximation analog-to-digital converter, which is flexible in its architecture and fast.

Another principal object of the present invention is to achieve a method for a flexible and fast conversion of analog signals to digital signals.

In accordance with the objects of this invention a method for an asynchronous analog-to digital conversion of analog signals has been achieved. The method invented comprises in the first step the provision of an asynchronous analog-to-digital converter, wherein the conversion range of the input voltage to be converted is between a maximum voltage Vdd1 and a minimum voltage Vdd2, comprising a reference voltage Vref, n-blocks according to n bits of a digital output, wherein each block comprises a comparator comparing said reference voltage with a voltage Vx being correlated to said input voltage, an arrangement of capacitors having each a unity capacitance C, and a digital output vector a(n) having n bits. The following steps comprise, in step 2 to start a sampling phase, in step 3 to store a charge in each block wherein said charge Qs is correlated with the unity capacitance C and the analog input voltage and in step 4 to start a measurement phase. The measurement phase comprises in step 5 to set a block counter N to the number of blocks, in step 6 to set the bit a(N) of the digital output to low if the comparator of the nth block detects that said voltage Vx>Vref and set to high if Vx<Vref, in step 7 to check if block counter N equals 1 and go then to step 10 else go to step 8. The last steps of the measurement phase comprise in step 8 to calibrate all following blocks with value of a(N), in step 9 to decrease the block counter N by 1 and go to step (6), and in the last step all bits of output are set.

In accordance with the objects of this invention a circuit for asynchronous analog-to digital conversion of analog signals has been achieved. A digital output of n-bits is generated, wherein the conversion of an analog input signal Vin is performed in a range between a maximum voltage Vdd1 and a minimum voltage Vdd2. The circuit comprises n-blocks wherein each of these blocks generates one correspondent bit of the digital output. A first block to generate the nth-output bit (or most significant bit) comprises, first, a switch having two terminals, wherein a first terminal is connected to a reference voltage and a second terminal is connected to a first terminal of a first capacitive means, to a first terminal of a second capacitive means, and to a positive input port of a comparator. This comparator, activated by an inverted s1 signal, indicating the start of a measurement phase, has said positive and a negative input and an output, wherein the negative input is connected to said reference voltage and the output is connected to an inverter. Furthermore this first block comprises a first capacitive means having a unity capacitance, wherein said first terminal is connected to said switch and a second terminal is connected to the output of a first 1-bit multiplexer, a second capacitive means having said unity capacitance, wherein said first terminal is connected to said switch and a second terminal is connected to the output of a second 1-bit multiplexer, a first 1-bit multiplexer, being controlled by said s1 signal, having two inputs wherein a first input is said Vdd1 voltage, and the second input is said analog input voltage Vin to be converted, a second 1-bit multiplexer, being controlled by said s1 signal, having two inputs wherein a first input is said Vdd2 voltage, and the second input is said analog input voltage Vin to be converted, and an inverter inverting the output of said comparator wherein the output of said inverter is the nth bit of the digital output. Furthermore the circuit invented comprises (n−1) more blocks, wherein each of any Nth block wherein N being any number between 1 and (n−1) generates the (N) th output bit and each of any Nth block is comprising, first, (n−N) means of a first type to calibrate said Nth block being, using the output of previous blocks, arranged in parallel wherein each of said means is controlled in sequence by the output bit of the correspondent block of the (n−N) previous blocks, and a switch having two terminals, wherein a first terminal is connected to a reference voltage and a second terminal is connected to a first of said means to calibrate and to a positive input port of a comparator. This comparator, activated by an inverted s1 signal, has said positive and a negative input and an output, wherein the negative input is connected to said reference voltage and the output is connected to an inverter. Furthermore these (n−1) more blocks comprise a means of second type to calibrate said Nth block being arranged in parallel to the last of said first type of means to calibrate and being controlled by said s1 signal, a third capacitive means having said unity capacitance, wherein a first terminal is connected to said second type of means to calibrate and a second terminal is connected to the output of a third 1-bit multiplexer, (n−N) fourth capacitive means having all twice said unity capacitance, wherein each of (n−N−1) fourth capacitance means are connecting respectively two first terminals of said first type of means to calibrate and a last of said fourth capacitive means connects a first terminal of a last of said first type of means to calibrate with a first terminal of said second type to calibrate, and said third 1-bit multiplexer, being controlled by said s1 signal, having two inputs wherein a first input is said Vdd2 voltage and the second input is the analog input voltage Vin to be converted.

In accordance with the objects of this invention a circuit for asynchronous analog-to digital conversion of analog signals, wherein a digital output of n-bits is generated has been achieved. The conversion of an analog input signal Vin is performed in a range between a maximum voltage Vdd1 and a minimum voltage Vdd2. The circuit comprises n-blocks wherein each of these blocks generates one correspondent bit of the digital output. A first block to generate the nth-output bit (or most significant bit) comprises, first, a switch having two terminals, wherein a first terminal is connected to a reference voltage and a second terminal is connected to a first terminal of a first capacitive means, to a first terminal of a second capacitive means, and to a positive input port of a comparator. This comparator, activated by an inverted s1 signal, has said positive and a negative input and an output, wherein the negative input is connected to said reference voltage and the output is connected to an inverter. Furthermore this first block comprises said first capacitive means having said unity capacitance, wherein said first terminal is connected to said switch and a second terminal is connected to the output of a first 1-bit multiplexer, said second capacitive means having said unity capacitance, wherein said first terminal is connected to said switch and a second terminal is connected to the output of a second 1-bit multiplexer, said first 1-bit multiplexer, being controlled by said s1 signal, having two inputs wherein a first input is said Vdd1 voltage and the second input is said analog input voltage Vin. Furthermore this first block comprises said second 1-bit multiplexer, being controlled by said s1 signal, having two inputs wherein a first input is said Vdd2 voltage and the second input is said input voltage Vin to be converted, and said inverter inverting the output of said comparator wherein the output is the nth bit of the digital output. Any other block N of the circuit invented generating an (N) th output bit, wherein said Nth block is any block of (n−1) blocks, is comprising, first, a switch having two terminals, wherein a first terminal is connected to a reference voltage and a second terminal is connected to a first terminal of a first capacitive means of a first group of capacitive means, to a first terminal of a second capacitive means of a second group of capacitive means, and to a positive input port of a comparator. This comparator, activated by an inverted s1 signal, has said positive and a negative input and an output, wherein the negative input is connected to said reference voltage and the output is connected to an inverter. Furthermore each Nth block comprises said first group of (n−N) capacitive means, each of them having said unity capacitance, wherein each of the first terminals of each of said capacitive means are connected to a first terminal of correspondent capacitive means of said second group of capacitive means and each of the second terminals of said capacitive means of said first group is connected to a correspondent output of a first group of 1-bit multiplexers comprising (n−N) multiplexers, said second group of (n−N) capacitive means each of them having twice said unity capacitance, wherein all said capacitive means of said second group are connected in series, wherein said first terminal of said first capacitive means of said second group is connected to said switch and to said first terminal of said first capacitive means of said first group of said capacitive means and wherein each of the first terminals of each of said capacitive means of said second group is connected to a first terminal of a correspondent capacitive means of said first group of capacitive means and the second terminal of the last capacitive means of said second group of capacitive means is connected to a first terminal of a third single capacitive means and to a first terminal of a fourth single capacitive means, and said third single capacitive means having said unity capacitance, wherein a second terminal is connected to the output of a third single 1-bit multiplexer. Furthermore each Nth block comprises said fourth single capacitive means having said unity capacitance, wherein a second terminal is connected to the output of a fourth single 1-bit multiplexer, said third single 1-bit multiplexer, being controlled by said s1 signal, having two inputs wherein a first input is said Vdd1 voltage and the second input is the analog input voltage Vin to be converted, said fourth single 1-bit multiplexer, being controlled by said s1 signal, having two inputs wherein a first input is said Vdd2 voltage and the second input is the analog input voltage Vin to be converted, and said first group of (n–N) 1-bit multiplexers, wherein the output of a first 1-bit multiplexer of said first group is connected to a second terminal of said first capacitive means of said first group of capacitive means, wherein all 1-bit multiplexers of the first group are controlled by said s1 signal, each of these 1-bit multiplexers have two inputs wherein a first input of each of said 1-bit multiplexers of the first group is the output of a correspondent 1-bit multiplexer of a second group of 1-bit multiplexers and the second input of all multiplexers of the first group is the analog input voltage Vin to be converted. Finally each Nth block comprises said second group of (n–N) 1-bit multiplexers, wherein the output of a first multiplexer of the second group is connected to said first input of said first 1-bit multiplexer of the first group, wherein said first of the multiplexers of said second group is controlled by the nth bit of the digital output and in sequence a second multiplexer of the second group is controlled by the (n–1) th bit of the digital output and the last multiplexer of said second group is controlled by the (N+1)th bit of the digital output, wherein a first input of each multiplexer of the second group is said Vdd1 voltage and a second input of each multiplexer of the second group is said Vdd2 voltage, and said inverter inverting the output of said comparator wherein the output is the (N)th bit of the digital output;

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a novel asynchronous successive approximation (ASA) analog-to digital converter (ADC).

Analog-to-digital converters (ADCs) are commonly converters synchronized with a system clock. Converters with a fixed conversion time are subject to errors due to metastability. These errors will occur in all converter designs with a fixed time for decisions, and are potentially severe. Another advantage of asynchronous ADCs is that problems linked to increased clock frequencies can be avoided such as e.g. complications regarding the clock effects on EMI, power dissipation, and average-case performance.

Figure 1A:
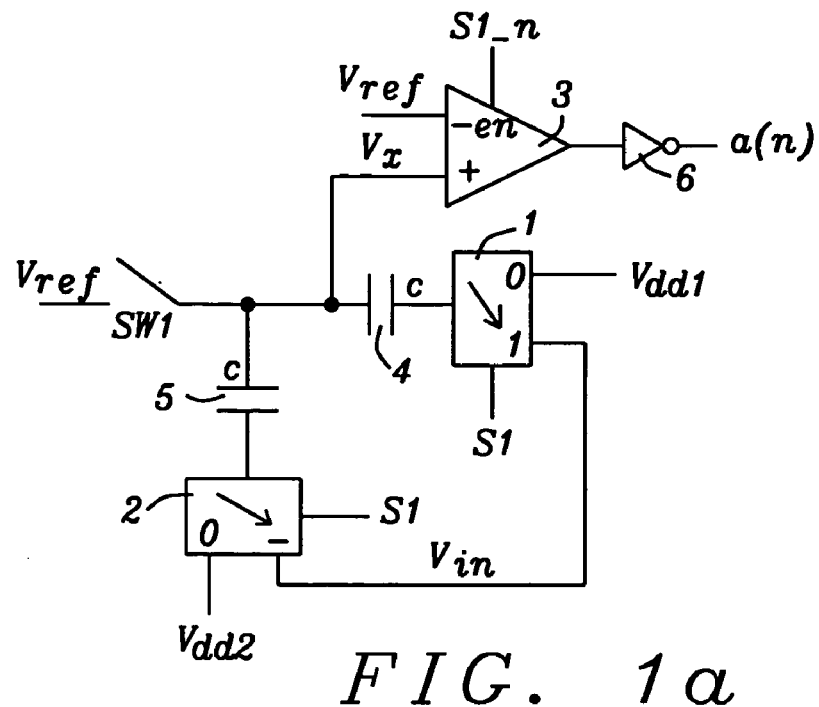
FIGS. 1a–c show a schematic of the first, the second and the last block of the asynchronous successive approximation ADC of the present invention.
Figure 1B:
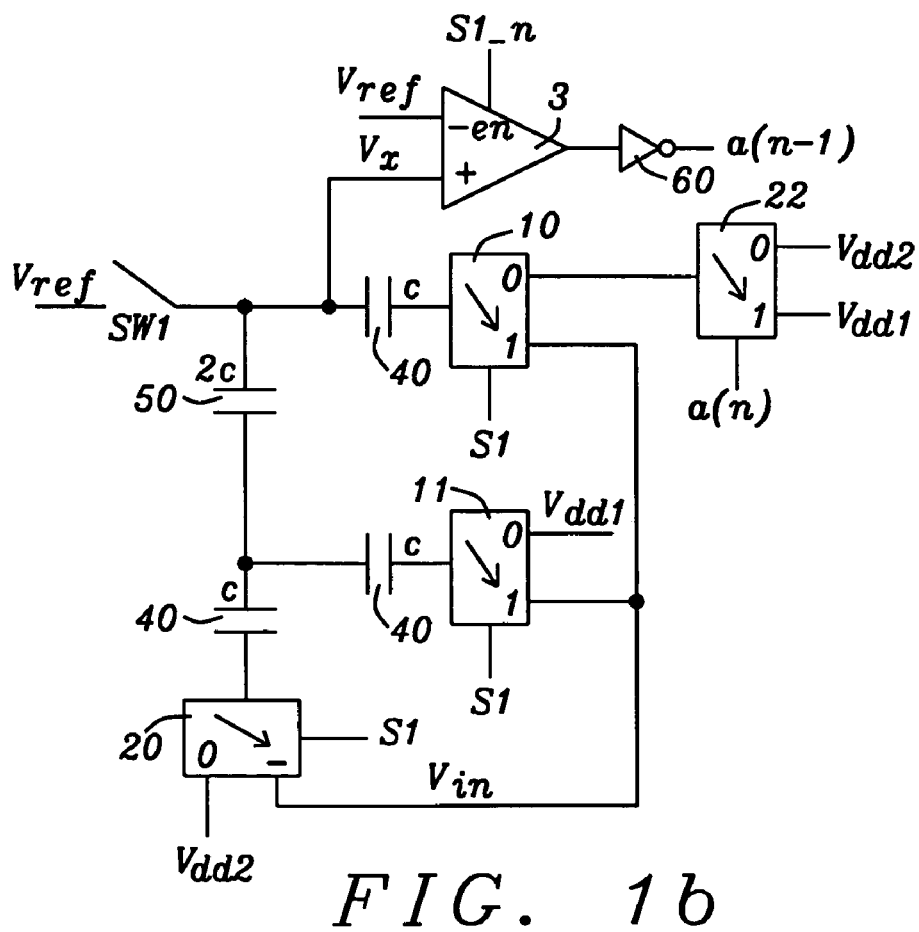
Figure 1C:
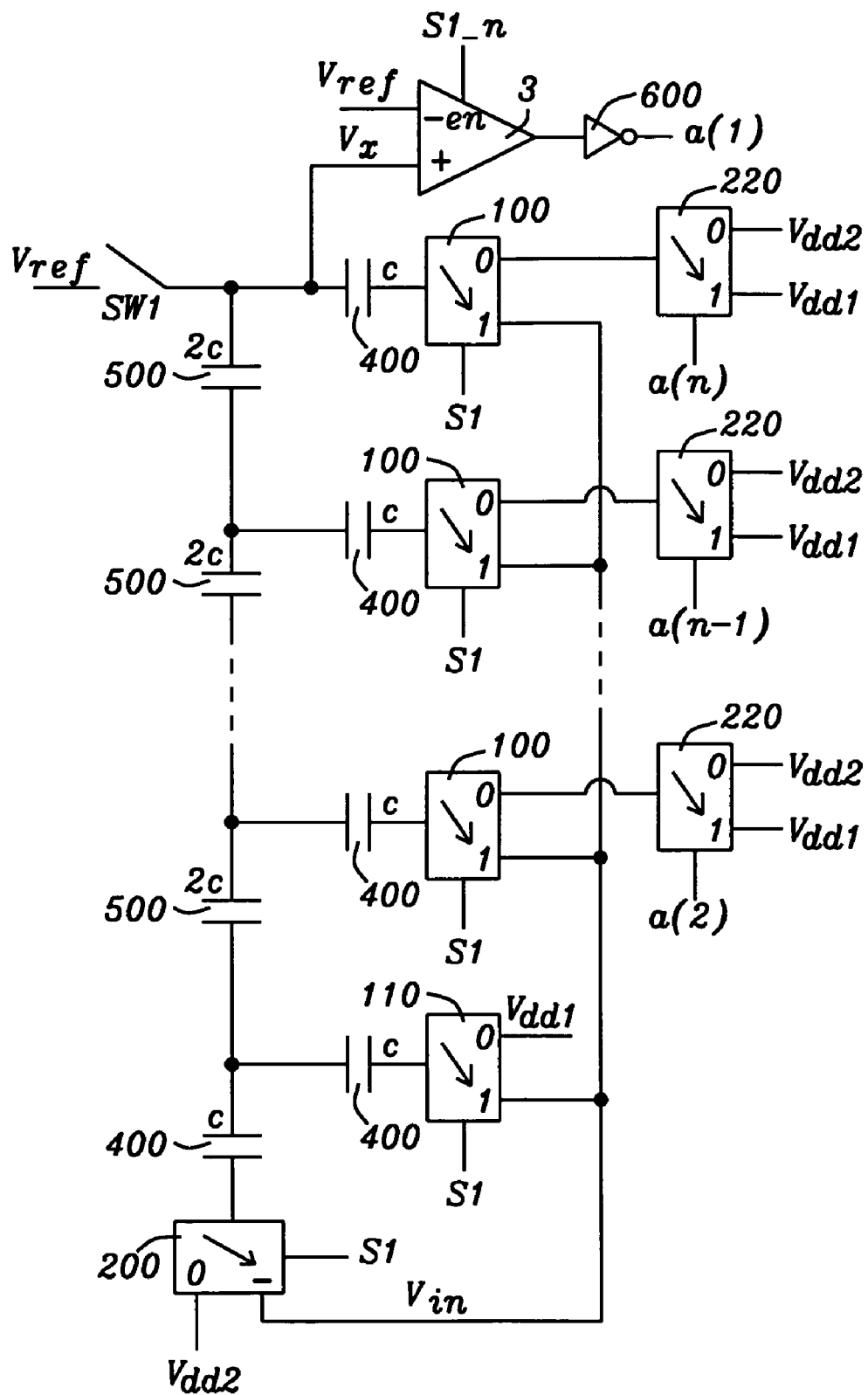

FIGS. 1a–c show block diagrams of selected blocks of the asynchronous successive approximation (ASA) ADC of the present invention. The ASA ADC converts an analog voltage signal Vin to an n-bits digital signal. This number n could be any suitable number. The resolution of an ADC is increased by increasing the number n of digital output bits.

The range of conversion is defined by the difference of the reference voltages Vdd1–Vdd2. The minimum value of the digital signal (all n bits are equal to 0) corresponds to Vin=Vdd2, while the maximum value (all n bits are equal to 1) corresponds to Vin=Vdd1.

The ASA ADC of the present invention comprises n blocks; each single block corresponds to one correspondent bit of the digital output signal. Each of these blocks generates a conversion bit and calibrates all following blocks as in a domino structure.

FIG. 1a shows the nth block of the ASA ADC having actually n blocks. This nth block generates the most significant bit (msb), which is the nth bit from the right of the digital output signal. FIG. 1c shows the first of n blocks. The block of FIG. 1c generates the least significant bit (lsb), which is the first bit from the right of the digital output signal. FIG. 1b shows the (n–1) th block of n blocks, generating the (n–1) th bit from the right of the digital output signal. It has to be understood that the number n of the blocks actually used depends on the actual requirements of the specific application of the ASA ADC of the present invention, especially in regard of the resolution required. One significant advantage of the ASA ADC of the present invention is its modular structure; each block is independent from all the other blocks. In order to avoid unnecessary complexity of the drawings only the nth, the (n–1) th and the first block are shown in FIGS. 1a–c.

Said nth block shown in FIG. 1a comprises a switch sw1, two capacitors 4 and 5 having both a unity capacitance C, two 1-bit multiplexers 1 and 2, wherein both are controlled by an s1 signal, a comparator 3, and an inverter 6. The 1-bit multiplexer 1 switches between Vin voltage and Vdd1 voltage. The input terminal of the switch sw1 is connected to Vref voltage.

In a preferred embodiment this Vin voltage is fed into the n blocks shown in FIGS. 1a–c by a unity gain amplifier. Other methods to feed in this Vin voltage are possible as well. The method selected depends upon the way this Vin signal is generated.

The 1-bit multiplexer 2 switches between Vin voltage and Vdd2 voltage. Said comparator 3, being enabled by an inverted s1 signal, compares a voltage Vx with a voltage Vref during a measurement phase controlled by an inverted signal s1_n. The output of the comparator is inverted by the inverter 6. This inverted signal is the a(n) signal corresponding with the nth bit of the digital output of the ASA ADC of the present invention.

The (n–1)th-block shown in FIG. 1b comprises also a switch sw1, three capacitors 40 having each a unity capacitance C, a capacitor 50 having twice the unity capacitance C, realized with two parallel unity capacitors in a preferred embodiment, four 1-bit multiplexers 10, 11, 20, and 22, a comparator 3, and an inverter 60. The input terminal of the switch sw1 is connected to Vref voltage. The 1-bit multiplexers 10, 11, and 20 are controlled by an s1 signal. The 1-bit multiplexer 22 is controlled by the output signal a(n) of the inverter 6 of the nth block shown in FIG. 1a as described above. This control of the (n–1) block by the output signal of the previous nth block demonstrates an important feature of present invention, the domino structure. This means that each block calibrates all following blocks.

The 1-bit multiplexer 22 switches between Vdd2 and Vdd1 voltages, the 1-bit multiplexer 10 switches between Vin and the output of the 1-bit multiplexer 22. The 1-bit multiplexer 11 switches between Vdd1 and Vin voltages and the 1-bit multiplexer 20 switches between Vin and Vdd2 voltages. In a same way as already described above with the nth block the comparator 3 of the (n−1)th block, being enabled by an inverted signal s1_n, compares a voltage Vx with a voltage Vref during a measurement phase activated by said inverted signal s1_n. The output of the comparator 3 is inverted by the inverter 60. This inverted signal is here the a(n−1) signal corresponding with the (n−1)th bit of the digital output of the analog-to digital converter of the present invention. This a(n−1) signal will be used to calibrate the following (n−2)th block according to the domino structure of the present invention.

The first block of an asynchronous analog-to-digital converter of the present invention having totally n-stages is shown in FIG. 1c. The number of stages n could be any number and corresponds to the number of bits of the digital output. This first block comprises also a switch sw1, 3×(n−1)+2 capacitors 400 and 500 wherein the capacitors 500, shown in FIG. 1c having each twice the unity capacitance C, have been realized with two parallel unity capacitors having each the capacity C and are counted therefore each as two capacitors. The input terminal of the switch sw1 is connected to Vref voltage.

Furthermore this first block comprises (n−1) 1-bit multiplexers 220 each of them switching between Vdd2 and Vdd1 voltages being controlled by a correspondent signal in order from the a(n) signal to the a(2) signal. This shows clearly the domino structure of the present invention, the first block shown in FIG. 1c is thus calibrated by all previous blocks.

Furthermore this first block comprises (n−1) 1-bit multiplexers 100, wherein each of them is controlled by the s1 signal and each of them is switching between Vin voltage and the output of a correspondent 1-bit multiplexer 220 in sequence from the 1-bit multiplexer 220 activated by the a(n) signal to the 1-bit multiplexer 220 activated by the a(2) signal, one 1-bit multiplexer 110 being controlled by the s1 signal and switching between Vin voltage and Vdd1 voltage, one 1-bit multiplexer 200 being activated by the s1 signal and switching between Vin voltage and Vdd2 voltage, a comparator 3, and an inverter 600. The comparator 3 of the first block, being enabled by an inverted s1 signal, compares the voltages Vref and Vx. The inverter 600 inverts the output of comparator 3 and provides herewith the lsb a(1) of the digital output of the analog-to-digital converter.

The total number Nc of unity capacitors required by the analog-to digital converter having n-stages, wherein each of them has the unity capacitance C, is given by the following equation, wherein the capacitors, having a capacitance of 2C are counted twice because they are actually two parallel unity capacitors:

$$Nc = 2 \times n + \sum_{i=1}^{n} 3x(i-1)$$

Any block N generating the (N)th output bit, wherein n is the total number of blocks and N defines any block within n blocks comprises, accordingly to the blocks shown in FIGS. 1a–c, a switch sw1, a comparator and an attached inverter, which is generating the (N)th output bit. Furthermore said block N comprises a first group of (n−N)+2 capacitors having each a unity capacity C, a second group of 2×(n−N) capacitors, wherein always two of these are connected in parallel to provide twice the unity capacitance. Additionally this Nth block comprises a first group of (n−N) 1-bit multiplexers, wherein all 1-bit multiplexers of this first group are controlled by said s1 signal, a second group of (n−N) 1-bit multiplexers, wherein said first of the multiplexers of said second group is controlled by the nth bit of the digital output and in sequence a second multiplexer of the second group is controlled by the (n−1)th bit of the digital output and the last multiplexer of said second group is controlled the (N+1)th bit of the digital output, wherein a first input of each multiplexer of the second group is said Vdd1 voltage and a second input of each multiplexer of the second group is said Vdd2 voltage. Finally this block N comprises a first single 1-bit multiplexer, being controlled by said s1 signal, having two inputs, wherein a first input is said Vdd1 voltage and the second input is the analog input voltage Vin to be converted, and a second single 1-bit multiplexer, being controlled by said s1 signal, having two inputs, wherein a first input is said Vdd2 voltage and the second input is the analog input voltage Vin to be converted.

The analog-to-digital conversion is performed in two phases, first a sampling phase and then a measuring phase.

During the sampling phase the sw1 switches of all blocks are closed, the s1 digital signal value goes to 1, and each block stores a charge Qs equal to $$Qs = 2 \times (Vref - Vin) \times C,$$

wherein C is the unity capacitance value of each single capacitor of each block.

During the measurement phase the sw1 switches of all blocks are opened, the s1 digital signal value goes to 0 and the comparators 3 of each block, enabled by the inverted signal s1_n compare the signal Vx on their positive inputs with the Vref signal on their negative inputs.

During the measurement phase in regard of the first block shown in FIG. 1a the 1-bit multiplexers 1 and 2, controlled by the s1 signal, switch both from 1 to 0 and the following relations are valid:

$$Qs = 2 \times (Vref - Vin) \times C = Qm = (Vx - Vdd1) \times C + (Vx - Vdd2) \times C, \text{ wherein}$$

Qs is the charge stored during the sampling phase, and C is the unity capacitance, Qm is the charge during the measurement phase and Vx is the voltage value at the positive input of the comparator 3. Furthermore the following relations are valid:

If $Vin = (Vdd1 + Vdd2)/2$ then $Vx = Vref$.

The inverted signal a(n) of the comparator 3 output of the block shown in FIG. 1a is low if Vx>Vref and consequently Vin<(Vdd1+Vdd2)/2. The signal a(n) is high if Vx<Vref and consequently Vin>(Vdd1+Vdd2)/2. The signal a(n) is used to calibrate the following blocks and corresponds to the nth bit, the msb.

The signal a(n) controls the 1-bit multiplexer 22 of the (n−1)th block of the ASA ADC of the present invention, shown in FIG. 1b. The signal s1 controls the 1-bit multiplexers 10, 11, and 20 of the (n−1)th block Therefore the following relations are valid:

$$Vin > \frac{Vdd1 + Vdd2}{2} \text{ AND } a(n) \text{ is high, then } Qs = 2 \times (Vref - Vin) \times C$$

$$Qs = 2 \times (Vref - Vin) \times C = Qm, \text{ and}$$

$$Qm = \left(\frac{Vx}{2} + \frac{Vdd1 + Vdd2}{4} - Vdd1\right) \times C +$$
$$\left(\frac{Vx}{2} + \frac{Vdd1 + Vdd2}{4} - Vdd2\right) \times C + \left(\frac{Vx}{2} - Vdd1\right) \times C.$$

Furthermore it shows, that $$\text{If } Vin = \frac{3 \times Vdd1 + vdd2}{4} : \text{ then } Vx = Vref.$$

The inverted signal a(n−1) of the comparator 3 output of the second block shown in FIG. 1b is high If Vx<Vref, this means that $$Vin > \frac{3 \times Vdd1 + Vdd2}{4}.$$

The inverted signal a(n−1) of the comparator output of the block shown in FIG. 1b is low If Vx>Vref, this means that $$Vin < \frac{3 \times Vdd1 + Vdd2}{4}.$$

In regard of the (n−1)th block shown in FIG. 1b the following relations are valid:

$$Vin < \frac{Vdd1 + Vdd2}{2} \text{ AND } a(n) \text{ is low,}$$

$$\text{then } Qs = 2 \times (Vref - Vin) \times C = Qm,$$

and $$Qm = \left(\frac{Vx}{2} + \frac{Vdd1 + Vdd2}{4} - Vdd1\right) \times C +$$
$$\left(\frac{Vx}{2} + \frac{Vdd1 + Vdd2}{4} - Vdd2\right) \times C + \left(\frac{Vx}{2} - Vdd2\right) \times C.$$

It shows that:

$$\text{If } Vin = \frac{3 \times Vdd2 + Vdd1}{4} : \text{ then } Vx = Vref.$$

The inverted signal of the comparator output a(n−1) of the block shown in FIG. 1b is high If Vx<Vref, this means that $$Vin > \frac{3 \times Vdd2 + Vdd1}{4}.$$

The inverted signal of the comparator output a(n−1) of the block shown in FIG. 1b is low if Vx>Vref, this means that $$Vin < \frac{3 \times Vdd2 + Vdd1}{4}$$

As shown above the signal a(n), generated by the block shown in FIG. 1a, corresponding with the nth bit, the msb of the digital output, has been used to calibrate all following blocks from the (n−1)th block to the first block. Furthermore the signal a(n−1), generated by the block shown in FIG. 1b and corresponding with the (n−1)th bit of the digital output is calibrating all following blocks from the (n−2)th block to the first block. The calibration continues for all the other blocks up to the last block shown in FIG. 1c, generating the signal a(1), corresponding to the first bit of the digital output. It is a "domino"-type structure.

Regarding now any Nth block of total n-blocks the input voltage Vin in the Nth block: is compared $$Vin > \text{ or } < \frac{Vdd1 + Vdd2}{2^{(n-N+1)}} + \sum_{i=N+1}^{i=n} \left[\frac{Vdd1}{2^{(n-i-1)}} a(i) + \frac{Vdd2}{2^{(n-i-1)}} \overline{a(i)}\right]$$

$$\text{for } N < n \text{ and } Vin > \text{ or } < \frac{Vdd1 + Vdd2}{2} \text{ for } N = n$$

wherein a(i) is the digital output of the (i)th block, and $\overline{a(i)}$ is its inversion. All values (a(n), a(n−1) . . . a(N+1) of the blocks preceding the Nth block are considered to define the value of a(N).

Referring to FIG. 1c the first block shown comprises (n−1) means to calibrate this first block using each of the (n−1) outputs of the preceding (n−1) blocks. Each of these means to calibrate a block comprise a 1-bit multiplexer 220, switching between Vdd1 and Vdd2 voltage, each are activated in sequence by a corresponding output signal a(n), a(n−1) . . . of a preceding block. Furthermore each of said means to calibrate comprises a second 1-bit multiplexer 100, switching between the output of a correspondent 1-bit multiplexer 220 and Vin voltage, controlled by said s1 signal, a unity capacitor C 400 connected to the output of a correspondent 1-bit multiplexer 100 and a second capacitor 500, having twice the unity capacitance C.

One advantage of the ASA ADC of the present invention is its modular structure; each block is independent from all others. The digital result of each block depends from the results of the blocks preceding it. The unity capacitances need to be matched only with the others of the same block.

The number Nc of required unity capacitors for an n-bit converter is defined by the equation:

$$Nc = 2 \times n + \sum_{i=1}^{i=n} 3x(i-1),$$

The design of the ADC invented is very flexible. The resolution of the ADC can easily increased by just adding additional blocks of the same structure on the side of the least significant bit, lsb. The ADC is very fast and its maximum speed is defined by the RC time constants during the sampling and measurement phases and by the speed of the comparators only.

In order to have the charges, stored in the capacitors of the n blocks during the sampling phase, available without losses in the measurement phase, it is important to avoid any overlapping between the sampling and measurement phase. This overlapping is prevented by introducing a delay between the signal opening the sw1 switch and the signal s1 driving the 1-bit multiplexers.

In a preferred embodiment all components have been built using CMOS technology and are implemented in an integrated circuit. It is obvious other semiconductor technologies, as e.g. bipolar technology, could be used as well and that discrete components, as e.g. capacitors, could be alternatively used.

Figure 2:
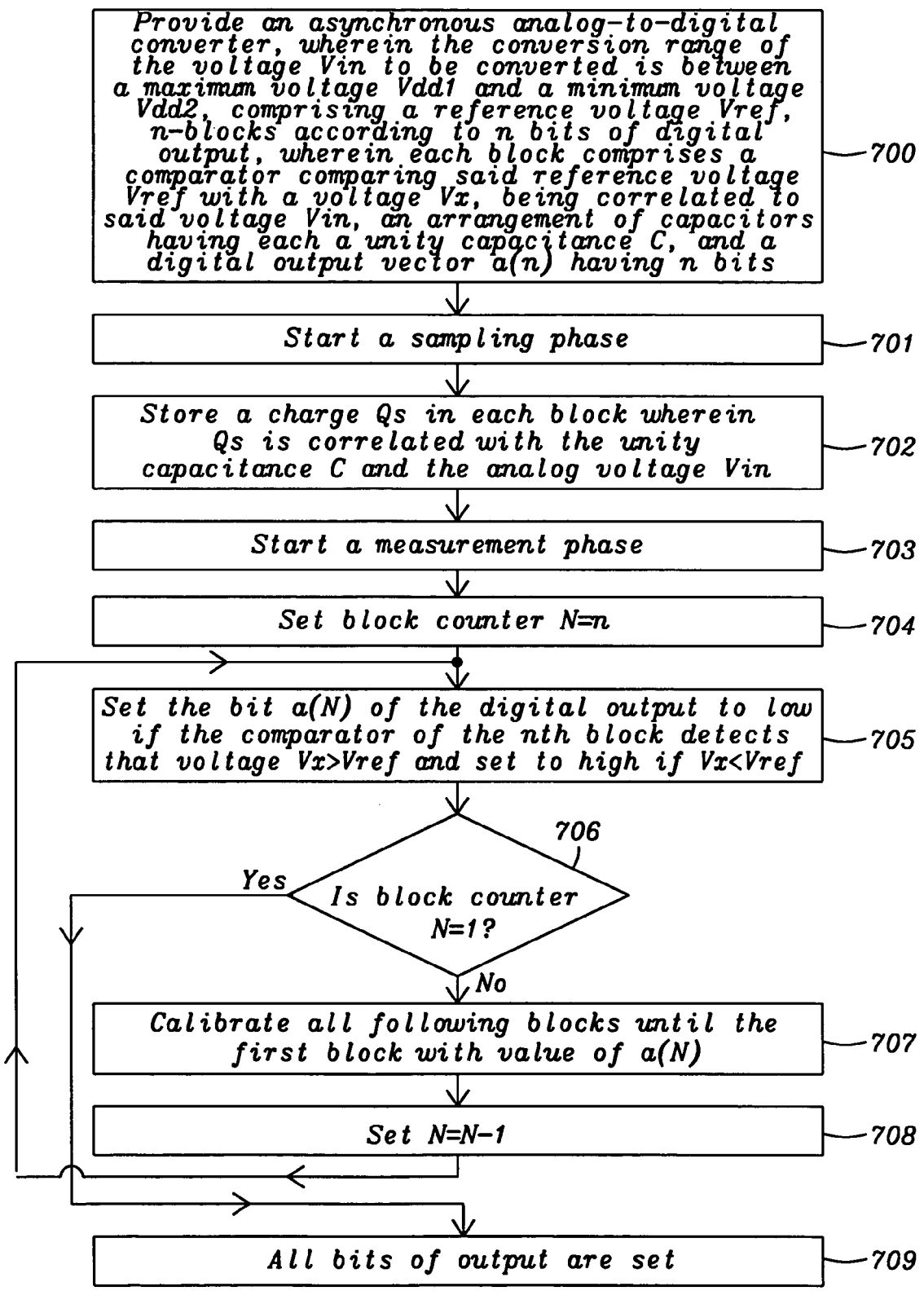
FIG. 2 shows a flowchart of the method invented to convert asynchronously an analog signal into a digital signal.

FIG. 2 illustrates a method to convert asynchronously an analog voltage to a digital number. The conversion of one analog voltage value Vin is shown in FIG. 2. It is obvious that this conversion can be repeated as often for new values of Vin as required. Step 700 describes the provision of an asynchronous analog-to-digital converter, wherein the conversion range of the voltage Vin to be converted is between a maximum voltage Vdd1 and a minimum voltage Vdd2, comprising a reference voltage Vref, n-blocks according to n bits of digital output, wherein each block comprises a comparator comparing said reference voltage Vref with a voltage Vx, being correlated to said voltage Vin, an arrangement of capacitors having each a unity capacitance C, and an digital output vector a(n) having n bits. In the next step 701 a sampling phase is started. In step 702 a charge Qs is stored in each block during this sampling phase wherein Qs is correlated with the unity capacitance C and the analog voltage Vin. A measurement is started in step 703 and in step 704 a block counter N is set to the value of the number of blocks n. In step 705 the bit a(N) of the digital output is set to low if the comparator of the nth block detects that voltage Vx>Vref and is set to high if Vx<Vref. If in step 706 the block counter N equals 1 then the process flow goes to the last step 709 else the process flow goes to the next step 707. In step 707 all following blocks until the first block are calibrated with the value a(N) of step 705. The block counter N is decreased by 1 in step 708 and the process flow goes back to step 705 to define the next value a(N). In the last step 709 all bits of the digital output are set.

While the invention has been particularly shown and described with reference to the preferred embodiments thereof, it will be understood by those skilled in the art that various changes in form and details may be made without departing from the spirit and scope of the invention.

What is claimed is:

1. A method for an asynchronous analog-to digital conversion of analog signals is comprising:
   (1) provide an asynchronous analog-to-digital converter, wherein the conversion range of the input voltage to be converted is between a maximum voltage Vdd1 and a minimum voltage Vdd2, comprising a reference voltage Vref, n-blocks according to n bits of a digital output, wherein each block comprises a comparator comparing said reference voltage with a voltage Vx being correlated to said input voltage, an arrangement of capacitors having each a unity capacitance C, and a digital output vector a(n) having n bits;
   (2) start a sampling phase;
   (3) store a charge in each block wherein said charge Qs is correlated with the unity capacitance C and the analog input voltage;
   (4) start a measurement phase;
   (5) set a block counter N to the number of blocks;
   (6) set the bit a(N) of the digital output to low if the comparator of the nth block detects that said voltage Vx>Vref and set to high if Vx<Vref;
   (7) check if block counter N equals 1 and go then to step (10) else go to step (8);
   (8) calibrate all following blocks until the first block with value of a(N);
   (9) decrease block counter N by 1 and go to step (6); and
   (10) all bits of output are set.

2. The method of claim 1 wherein said charge Qs is stored in the capacitors of each block.

3. The method of claim 2 wherein said charge Qs amounts Qs=2×(Vref−Vin)×C, wherein Vref is said reference voltage, Vin is said analog input voltage and C is said unity capacitance.

4. The method of claim 1 wherein said bit a(N), is set to low if $$Vin < \frac{Vdd1 + Vdd2}{2^{(n-N+1)}} + \sum_{i=N+1}^{i=n} \left[ \frac{Vdd1}{2^{(n-i-1)}} a(i) + \frac{Vdd2}{2^{(n-i-1)}} \overline{a(i)} \right] \text{ for } N < n,$$

$$\text{or } Vin < \frac{Vdd1 + Vdd2}{2} \text{ for } N = n,$$

wherein a(i) is the output of the (i)th block and $\overline{a(i)}$ is its inversion.

5. The method of claim 1 wherein said bit a(N), is set to high if $$Vin > \frac{Vdd1 + Vdd2}{2^{(n-N+1)}} + \sum_{i=N+1}^{i=n} \left[ \frac{Vdd1}{2^{(n-i-1)}} a(i) + \frac{Vdd2}{2^{(n-i-1)}} \overline{a(i)} \right] \text{ for } N < n,$$

$$\text{or } Vin > \frac{Vdd1 + Vdd2}{2} \text{ for } N = n,$$

wherein a(i) is the output of the (i)th block and $\overline{a(i)}$ is its inversion.

6. The method of claim 1 wherein a delay is introduced before the start of said measurement phase.

* * * * *